United States Patent

Harada et al.

[11] Patent Number: 5,112,641
[45] Date of Patent: May 12, 1992

[54] WAFER TRANSFER METHOD IN VERTICAL CVD DIFFUSION APPARATUS

[75] Inventors: Yasuhiro Harada, Ome; Toshikazu Karino, Higashimurayama; Ryoji Saito, Tokyo; Koji Tometsuka, Tokyo; Shoichiro Izumi, Tokyo, all of Japan

[73] Assignee: Kokusai Electric Co., Ltd., Tokyo, Japan

[21] Appl. No.: 466,973

[22] Filed: Jan. 18, 1990

[30] Foreign Application Priority Data

Jan. 28, 1989 [JP] Japan .................................. 1-19230

[51] Int. Cl.⁵ .............................................. C23C 16/00
[52] U.S. Cl. ................................... 427/8; 427/248.1; 437/8; 118/715; 118/729
[58] Field of Search ................. 118/715, 729; 437/8; 427/8, 248.1

[56]  References Cited

U.S. PATENT DOCUMENTS

| | | | |
|---|---|---|---|
| 4,402,613 | 9/1983 | Daly et al. | 414/331 |
| 4,439,146 | 3/1984 | Sugita | 414/331 |
| 4,597,819 | 7/1986 | Kusuhara et al. | 414/331 |
| 4,645,401 | 2/1987 | Hopkins et al. | 414/222 |
| 4,770,590 | 9/1988 | Hugues et al. | 414/331 |
| 4,775,281 | 10/1988 | Prentakis | 414/416 |
| 4,910,042 | 3/1990 | Hokynar | 118/719 |
| 4,955,775 | 9/1990 | Ohkase et al. | 414/416 |
| 4,957,406 | 9/1990 | Akagawa | 414/416 |
| 4,966,519 | 10/1990 | Davis et al. | 414/416 |

FOREIGN PATENT DOCUMENTS 62130524   8/1962   Japan .
 6435746   3/1964   Japan .
61-291335  12/1986  Japan .

OTHER PUBLICATIONS

English translation of Japanese Patent Application No. 62-130524.

Primary Examiner—Richard Bueker
Attorney, Agent, or Firm—Graham & James

[57]  ABSTRACT

A wafer transfer method and mechanism in a vertical CVD diffusion apparatus and a control device for the method and mechanism. The vertical-type CVD diffusing apparatus has a boat containing many wafers in a horizontal orientation, stacked vertically. Product wafers are transferred to the boat five by five, dummy wafers are transferred five by five or a fraction less than five, and monitor wafers are inserted one by one between a block of the product wafers and another block of the product wafers, or a block of the dummy wafers.

4 Claims, 10 Drawing Sheets

WAFER TRANSFER METHOD IN VERTICAL CVD DIFFUSION APPARATUS

BACKGROUND OF THE INVENTION

The present invention relates to transferring wafers in a vertical CVD (Chemical Vapor Deposition) diffusion apparatus.

Nowadays, the manufacturing process of semiconductor elements or chips includes a CVD diffusion treatment step for them. In the treatment step, a predetermined number of silicon wafers are heated in a CVD diffusion apparatus in order to diffuse and deposit some material chemically on the silicon wafers. According to the conventional technology of manufacturing semiconductor chips, in order to uniformly and homogeneously diffuse and deposit some material on the wafers, a plurality of dummy wafers are arranged respectively at the top and the bottom of a column extending, for example, in a vertical line as shown in FIG. 11, sandwiching a group of product wafers. In the groups of product wafers, single monitor wafers are inserted in the product wafers at positions separated by a predetermined vertical distance.

The technology of manufacturing semiconductor chips will be explained in detail with reference to FIG. 11 showing one example of the wafer arrangement. The wafer group 1 is supported or held by a boat 2 in the diffusion furnace in order to apply the CVD diffusion treatment step to the wafers. The wafers are arranged in a predetermined manner and inserted into the boat 2 and the boat 2 is charged to the diffusion furnace. In general, the whole interior area or space of the diffusion furnace fails to have a uniform or homogeneous thermal distribution and consequently the boat 2 to be placed in the interior of the diffusion furnace has a surplus space relative to the number of product wafers to enable it to hold, for example, one and a half times the number of product wafers. According to the conventional technology, the product wafers are applied or placed in the portion of the boat to be placed at a part of the diffusion furnace, which has a uniform thermal distribution or the product wafers are placed in the portion of the boat having an uniform thermal distribution when the number of wafers to be treated is small relative to the furnace interior.

Two dummy wafer groups S and 4, respectively consisting of a suitable number of dummy wafers 1b, are situated at the upper end and the bottom end of the wafer arrangement held in the boat 2. Between the dummy wafer groups 3 and 4, there are groups of product wafers 5, each including a predetermined number of product wafers 1a. Each monitor wafer 1c are inserted into the group of product wafers 5 at suitable positions. A monitor wafer 1c is also placed between the lowest product wafer group 5 and the dummy wafer group 4.

FIG. 12 shows a conventional wafer transfer mechanism for transferring untreated wafers charged, or loaded, in a cassette 7 to the boat 2 and recharging the treated wafers to a vacant cassette 7. The wafer transfer mechanism shown in FIG. 12 is adapted to transferring or treating wafers one by one and it is called a one-by-one type mechanism. As is apparent from the drawing, the mechanism has a handling unit 6, around which there are a predetermined number of cassettes 7, holding wafers 1, respectively situated along the same circumference of the handling unit 6. A transfer elevator 8 and a load-unload elevator 9 are placed near the handling unit 6. The boat receiving stand 10 of the transfer elevator 8 is adapted to ascend and descend along a generatrix of the cylindrical surface of vertical diffusion furnace 12 including the circumference thereof. Vertical diffusion furnace 12 is placed above the boat receiving stand 11 of the wafer load-unload elevator 9. A shifting unit 13 for shifting boats 2 is installed between the transfer elevator 8 and the load-unload elevator 9.

The handling unit 6 has a rotation arm 14 ascending and descending with rotation around the circumference and a wafer sucking chuck 15 mounted on the rotation arm 14 so as to move along the diametric of the circumference along the rotation arm 14. The wafer sucking chuck 15 sucks the wafers 1 loaded in the cassette 7 one by one and takes them out of the cassette 7 and the respective wafers are placed successively upon the top wafer of the wafer group in the boat 2 set on the elevator 8. The transfer elevator 8 follows the progress of the wafer transfer and descends step by step. When transfer of all the wafers 1 from the cassettes 7 to the boat 2 is completed, the boat 2 containing wafers is shifted from the transfer elevator 8 to the load-unload elevator 9 by the shifting unit 13, and the load-unload elevator 9 then charges the boat 2 to the diffusion furnace 12.

After a CVD diffusion treatment step to be carried out in the furnace to the boat 2 is completed the treated boat 2 is taken out from the diffusion furnace 12. The boat 2 is then shifted to the transfer elevator 8 by means of the shifting unit 13 and the wafers follow the reverse processing course by the handling unit 6, being reloaded to the cassette 7.

FIG. 13 depicts another type of wafer transfer mechanism in which bundles of wafers are transferred to the boat 2.

In detail, the wafer sucking chuck 15 provided in the conventional wafer transfer mechanism shown in FIG. 13 has a set of twenty five (25) sucking plates 16. All sucking plates 16 function at a time to suck all twenty five wafers, for example, respectively loaded in a cassette 7 and transfer them collectively to the boat 2.

It is understood in the art that these respective wafer transfer mechanisms of the one-by-one type and the collective type have some shortcomings as will be described.

In general, the number of dummy wafers placed at the top and the bottom of the wafer arrangement to be placed on the boat 2, and the number of monitor wafers and the place at which these monitor wafers are inserted into the group of product wafers change according to the specific treatment condition and the particular treatment specification of customers. The former type of wafer transfer mechanism transfers wafers one by one to the boat, so it is possible to be applied to any case or any arrangement of the wafers. However, the conventional mechanism of this type has the shortcomings of requiring many operations of the mechanism, a long time required for transferring wafers, resulting in a deteriorating of the efficiency of the whole mechanism. Also, the need for many operations increases the possibility of dust generation from and around the moving parts of the mechanism, deteriorating the quality of product wafers or semiconductor chips.

On the other hand, the latter type of wafer transfer mechanism has the merits of a short time for transferring the wafers and accordingly the efficiency of this type of mechanism is very good.

However, it is noted that the mechanism of this type handles and treats twenty five wafers collectively or in one lot and in consequence it is impossible to rearrange or change the wafer arrangement during the transferring step. As a result, it is always necessary to previously arrange or charge in accordance with a predetermined wafer arrangement including dummy wafers, monitor wafers, and product wafers to the cassette. According to the prior art, the wafers are manually charged to the cassette and the manual charging operation of various kinds of wafers to the predetermined or desired pattern of the wafer arrangement is apparently very complicated, inducing bad efficiency of the mechanism and error insertion of wafers or wrong arrangement of wafers.

Considering the real situation of the technology, the applicant of the present invention previously filed Japanese Utility Model Appln. No.62-130524, in which a wafer transfer mechanism of a partly bulk transfer type can effectively transfer five wafers at a time to a boat. According to the present invention, the characteristics or merits of the one-by-one type and the collective type of the wafer transfer mechanism are combined, so that it is possible to exhibit the merits of both of these the wafer transfer method, the wafer transfer mechanism, and the transfer control apparatus to provide good efficiency without human error in insertion or arrangement of wafers.

EXPLANATION OF THE PREFERRED EMBODIMENT

A preferred embodiment of the wafer transfer method, the wafer transfer mechanism, and the transfer control apparatus, respectively of the present invention, will be explained with reference to the accompanying drawings.

The vertical CVD diffusion apparatus provided with the wafer transfer control apparatus according to the present invention will be described in relation to FIGS. 1 and 2.

Figure 1:
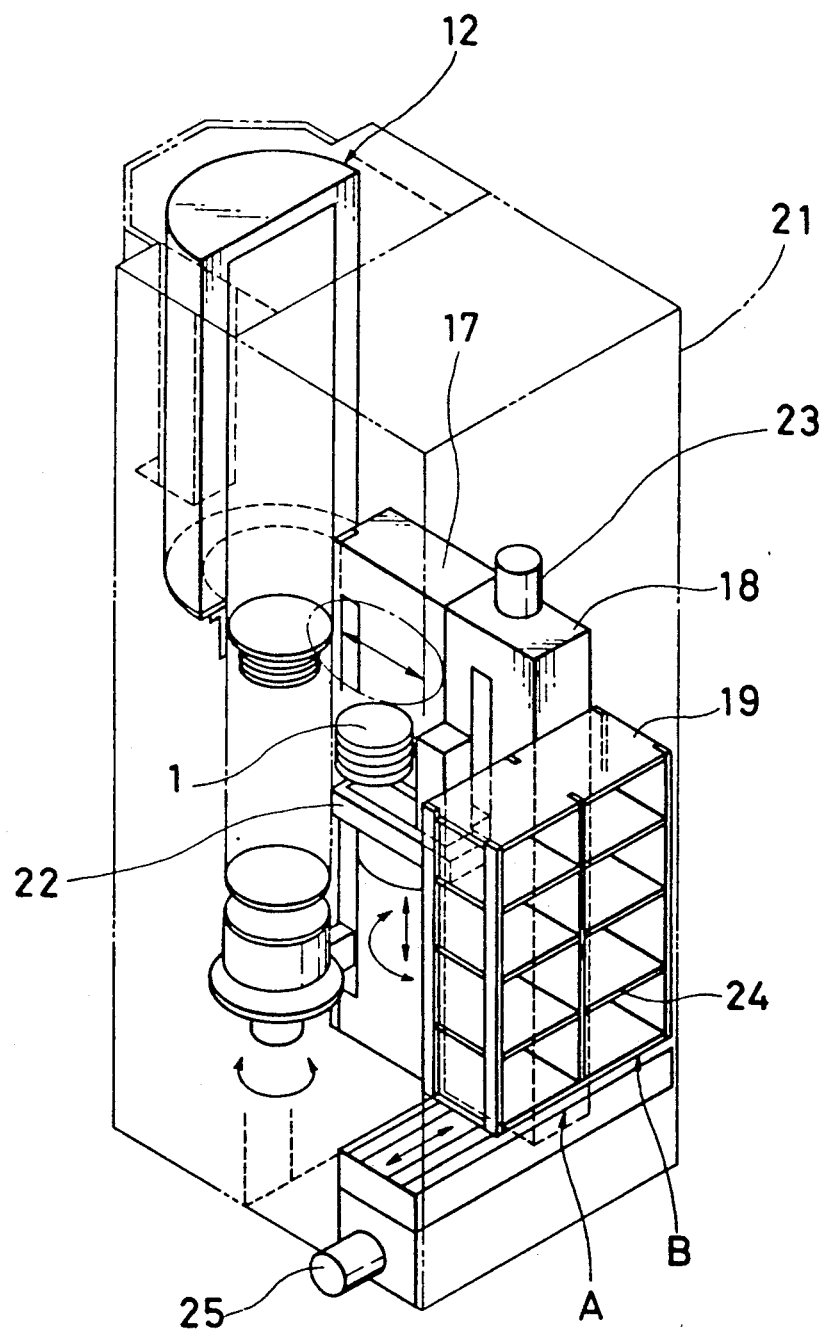
FIG. 1 is a perspective view of a vertical CVD diffusion apparatus provided with the wafer transfer mechanism according to the present invention.
Figure 2:
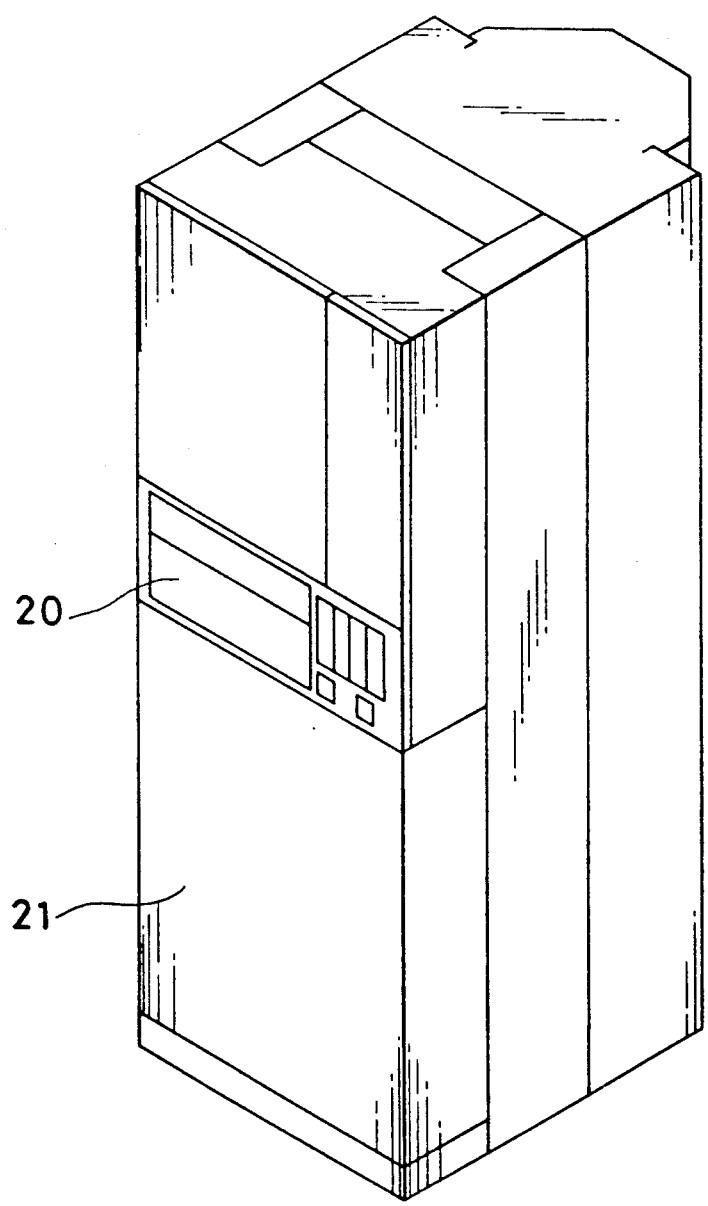
FIG. 2 is a perspective view of the outside appearance of the CVD diffusion apparatus.

As shown in FIGS. 1 and 2, the wafer transfer mechanism 21 consists of the diffusion furnace 12, the load-unload elevator 17, the transfer elevator 18, and the cassette stocker 19. The operation panel 20 of the mechanism 21 is shown in FIG. 2. The load-unload elevator 17 has a boat 2 adapted to be charged and taken out of the diffusion furnace 12 when the load-unload elevator 17 descends or ascends.

The transfer elevator 18 has a handling unit 22 adapted to descend and ascend in response to a driving of the elevating motor 23. The cassette stocker 19 has cassette stocking racks 24 of a desired number of steps (four steps in the embodiment as shown in FIG. 1) and a plurality of rows (two rows in the embodiment), and moves horizontally by means of a rack transverse traveling motor 25 or a motor for moving horizontally the racks 24. The handling unit 22 of the main part of the wafer transfer mechanism will be explained in detail with reference to FIG. 3. A slide mechanism 28 is attached to a base plate 26 fixed to the transfer elevator 18 through a coaxial speed reducer 27. A wafer chuck 29 is attached to the slide mechanism 28.

The base plate 26 has a motor 30 fixed thereto. An output shaft 31 of the motor 30 and an input shaft 32 of the speed reducer 27 are connected through a timing gear 33, a timing belt 34, and a timing gear 35. The slide mechanism 28 is fixed to the output shaft 36 of the speed reducer 27. The reducer 27 has a hollow central portion 37 through which a cable 38, a vacuum hose 39 of a wafer chuck which will be described later, and the like pass.

The slide mechanism 28 has a guide bar 40 extending horizontally and crosswisely to the rotary axis of the speed reducer 27 and a rotatable screw rod 41 extending in parallel with the guide bar 40. The guide bar 40 has a slider 42 which is engaged with the screw rod 41 through a nut block 43. There is a slide motor 44 at the side of the guide bar 40 which is connected to the screw rod 41 through a timing pulley 45, a timing belt 46, and a timing pulley 47.

The slide mechanism 28 has a set of limit sensors 48 and 49 for detecting the ends of travel of the slider 42, and a set of shield plates 80 and 61 for functioning these limit sensors 48 and 49.

The wafer chuck 29 to be attached to the slider 42 has five chuck plates 54, 55, 56, 57, 58 having the same pitch or gap as that of the wafers when stored. The chuck plates, respectively have a thin box construction provided with its inner hollow portion and sucking holes 58 formed at it upper surface. These inner hollow portions of the chuck plates are led to the vacuum source through magnetic valves 59, 60, 61, 62, 63, which will be explained.

Operation of the wafer transfer mechanism of the present invention will be described.

Each row of the cassette storing positions of the storing or stocking racks 24 is named A row and B row and respective steps of the stocking racks 24 are called first step, second step-fourth step from the bottom one. In consequence, they are marked in A1, A2 ... B1, B2 ... . As shown in FIGS. 5, 7, 8 and 9, a cassette 7b to which dummy wafers are charged or stored, a cassette 7c to which monitor wafers are charged, and a cassette 7a to which product wafers are charged, respectively are stocked in the predetermined or particular stocking positions of the stocking racks 24.

Figure 3:
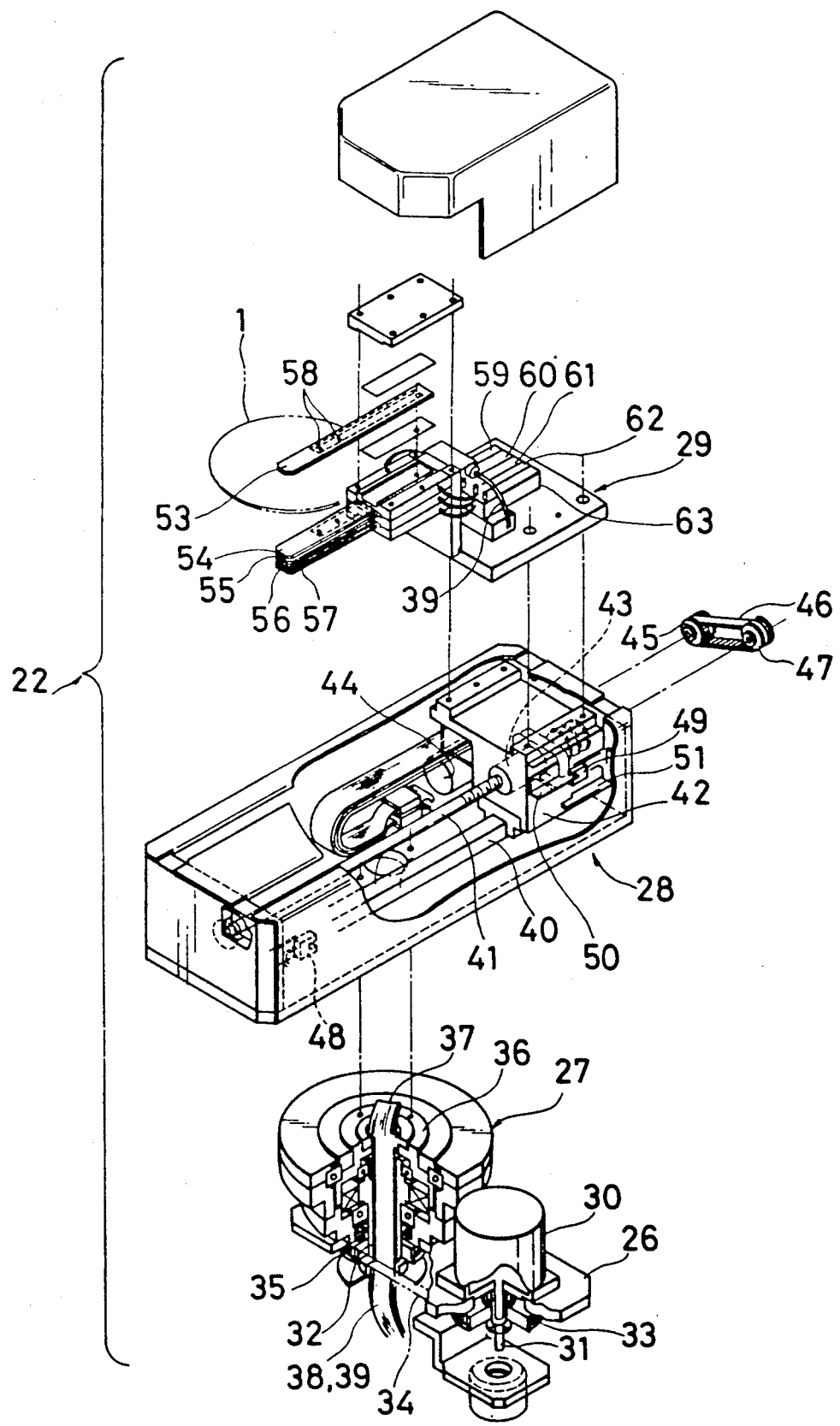
FIG. 3 is a disassembled perspective of the handling unit.

The handling unit 22 shown in FIG. 3 takes the particular or desired wafers 1 out of the cassette stocking racks through the cassette stocker side 19 and transfers them to the boat 2 so as to arrange them in the predetermined manner or arrangement. More specifically the handling unit 22 first moves to the position at which the cassette 7, including the particular wafers 1, is placed, in response to the cooperating functions of the rack transverse travelling motor 25 and the elevating motor 23. Then the slide motor 44 rotates the screw rod 41 in order to position the chuck plates 53, 64, 55, 66, 57 of the wafer chuck 29 between two wafers 1. The elevating motor 23 elevates the wafer chuck 29 a little and separates five wafers 1 from the remaining wafers below, taking or receiving the group of the five wafers 1. The wafers 1 received are sucked by operation of the magnetic valves 59, 60, 61, 62, 63 and held by chucking. Then the slide motor 44 is driven to reverse the slider 42 and the wafers 1 are taken completely out of the cassette 7. The rotation motor 30 rotates the slide mechanism 28 through the timing gear 33, the timing belt 34, the timing gear 35, and the speed reducer 27. The elevating motor 23 elevates the wafer chuck 29 to the inserting position of wafers stored in the boat 2. Then the slide motor 44 advances the wafer chuck 29 to insert the wafers 1 into the boat 2. On operating the magnetic valves 59, 60, 61, 62, 63 after the wafer insertion, the elevating motor 23 descends the wafer chuck 29 a little to leave the five wafers in the boat 2 and the slide motor 44 reverses the wafer chuck 29.

Repeating the operations above, all the wafers are transferred from the side of the cassette stocker 19 to the boat 2. Reversing the operations above transfers or backs the wafers from the boat 2 to the side of the cassette stocker 19.

By suitably combining the respective transfer procedures mentioned above and controlling the combined procedures, these wafers 1 are transferred to the boat 2 and the desired arrangement of the wafers is obtained.

Figure 4:
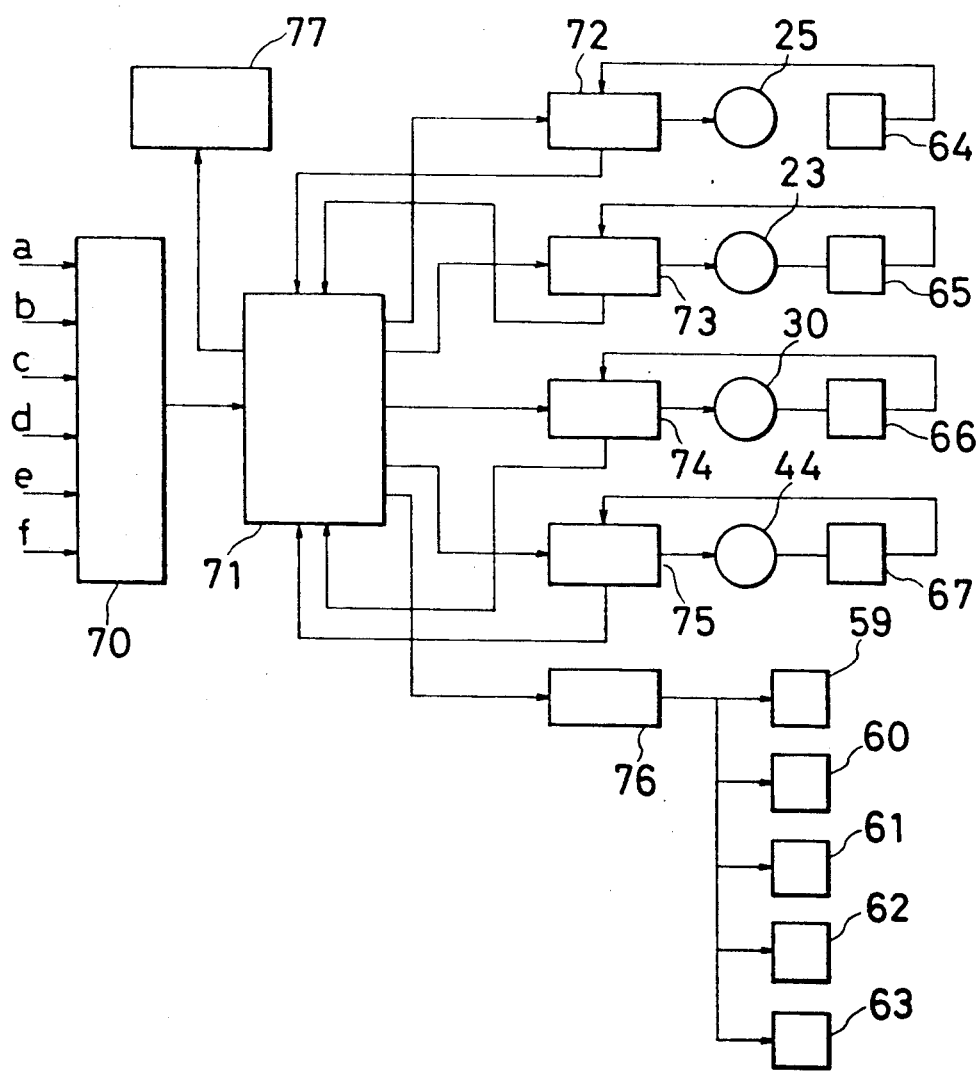
FIG. 4 is a block diagram of the transfer control apparatus according to the present invention.

FIG. 4 shows the control apparatus used to combine and control the wafer transfer procedures or steps.

The operator inputs to the control apparatus through an input board 70 positions (a) of the product wafer cassette 7a, the dummy wafer cassette 7b, the monitor wafer cassette 7c, respectively stored in the wafer stocking racks 24, a number (b) of the upper dummy wafers, a number (c) of the lower dummy wafers, a number (d) of the monitor wafers, a position (e) of the monitor wafers, and a number (f) of the product wafers.

A main control portion 71 has a sequence program outputting operative commands of operative conditions of the positions (a), the number (b), the number (c), the number (d), the position (e), and the number (f), respectively inputted through the operator and displays the operative conditions and guidance messages on a display 77 operatively connected to the main control portion 71. The motor controllers 72, 73, 74, 75 receive feed-back signals from the position sensor 64, respective encoders 65, 66, 67 and drive the rack transverse travelling motor 25, the elevating motor 23, the rotation motor 30, the slide motor 44 while monitoring them so as to follow the operative commands from the main control portion 71. The magnetic valve control portion 76 operates the magnetic valves of the number and positions, which are determined previously according to the number of the wafers 1 to be chucked.

After driving the respective motors 25, 23, 30, 44 and magnetic valves 59, 60, 61, 62, 63 according to the operative commands, motor controllers 72, 73, 74, 75, 76 output a complete or finish command to the main control apparatus 71. The main control apparatus 71 then outputs the next operative command of the sequence program.

Further control operations will be described with reference to FIGS. 6-9.

For example, presuming that the operator charges the dummy cassettes 7b to the position A1 of the cassette stocking racks 24, the monitor cassettes 7c to the position B1 of the racks 24, and the product cassettes 7a to the remaining positions, respective stocking positions of the respective cassettes are inputted to the input board 70 as the operative conditions (a). Presuming that the number of the upper dummy wafer 1b is eight (8) and that of the lower dummy wafer 1b is twelve (12), b=8 and c=12 are set in the operative condition (b), (c). In this situation, the condition of b+c=5n is set as the number of the dummy wafer. Presuming that the number of the monitor wafer 1c is five, and that of the product wafers 1a situated between the monitor wafers is twenty five (25), operative conditions of d=5 ... f=25 are sequentially inputted. Concerning the number of the product wafers of twenty five, the number is a standard one and determined because the wafer stocking number of the standard cassette 7 is twenty five. Any number can be employed for the product wafers situated between the monitor wafers if it is a multiple of five.

After the operative conditions are inputted and set and the start button is pressed, the main control apparatus 71 outputs operative commands of the sequence program to respective control portions.

The motor controller 72 for the rack transverse travelling motor 25 and the motor controller 73 for the elevating motor 23 are driven to move the handling unit 22 to the position facing to the position A1 of the wafer stocking racks 24. Completion of the transfer of the handling unit 22 and of the wafer stocking racks 24 is recognized by the feedback signal sent from the encoder 68 and the position sensor 64 and the completion signal is inputted to the main control apparatus 71 through the motor controller 72 and another motor controller 73. After the input of the completion signal from the main control apparatus 71, the apparatus inputs wafer transfer commands to the elevating motor controller 73, the rotation motor controller 74, the slide motor controller 75, and the magnetic valve controller 76. As a result, respective controllers 73, 74, 75, 76 suitably drive the elevating motor 23, the rotation motor 30, the slide motor 44, and each of magnetic valves 59, 60, 61, 62, 63. It is apparent that, as mentioned above, operation of each motor 23, 30, 44 is monitored by encoders 65, 66, 67 and when the operations are finished a completion signal is inputted to the main controller 71. After that, similar transfer operations or procedures as mentioned above are carried out. The movement of the handling unit 22 to the stocking positions of the monitor wafer cassette 7c and the product wafer cassette 7a is similar to that already explained above.

The transfer procedures of the wafers 1 from the cassette 7 to the boat 2 will be explained.

Figure 5:
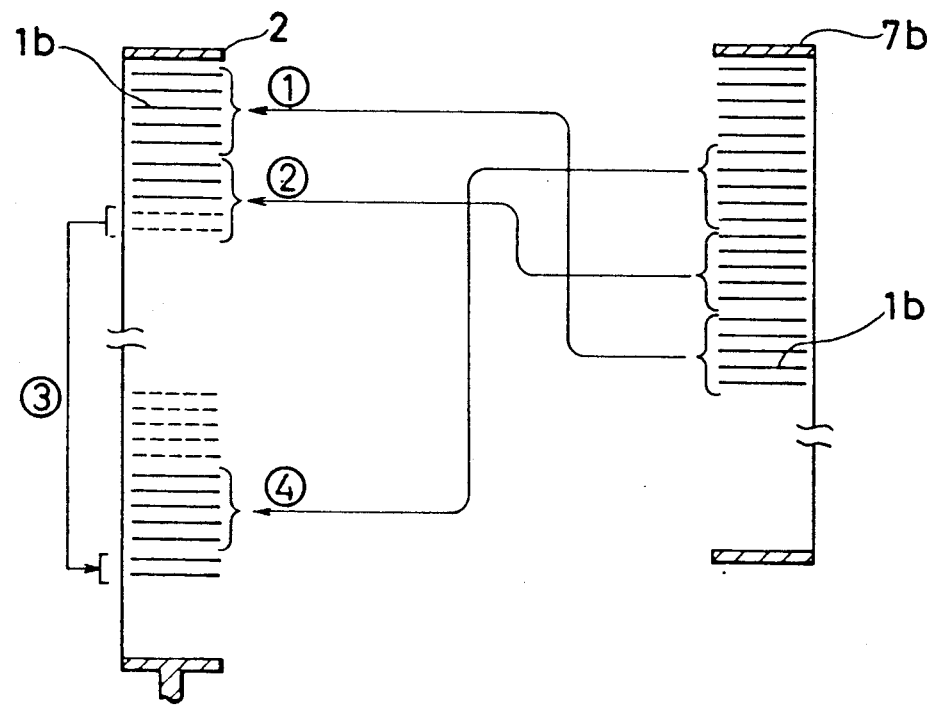
FIGS. 5-9 are explanation views of wafer transfer operation in accordance with the present invention.

When eight dummy wafers 1b are Inserted in the boat 2 at its upper position as shown in FIG. 5, the lower five dummy wafers 1b stocked in the cassette 7b are chucked and transferred to the top position of the wafer arrangement as shown by the movement line ① and another five dummy wafers 1b in the cassette 7b are chucked and inserted in the boat 2 at the position below the previous-stocked dummy wafers 1b (see the line ②). Next, the lowest two dummy wafers 1b of the dummy wafers 1b previously inserted in the boat 2 are chucked by the upper two chuck plates 53 and 84 (see FIG. 10) and transferred to the lowest position of the wafer arrangement along the line ③. Five dummy wafers 1b to be placed on the lowest dummy wafers 1b are then transferred from the positions in the cassette 7b along the movement line ④. The transfer operation is temporarily stopped at this situation and the upper five dummy wafers to be positioned on the last wafers ar not placed as shown by dotted lines in FIG. 5.

Figure 6:
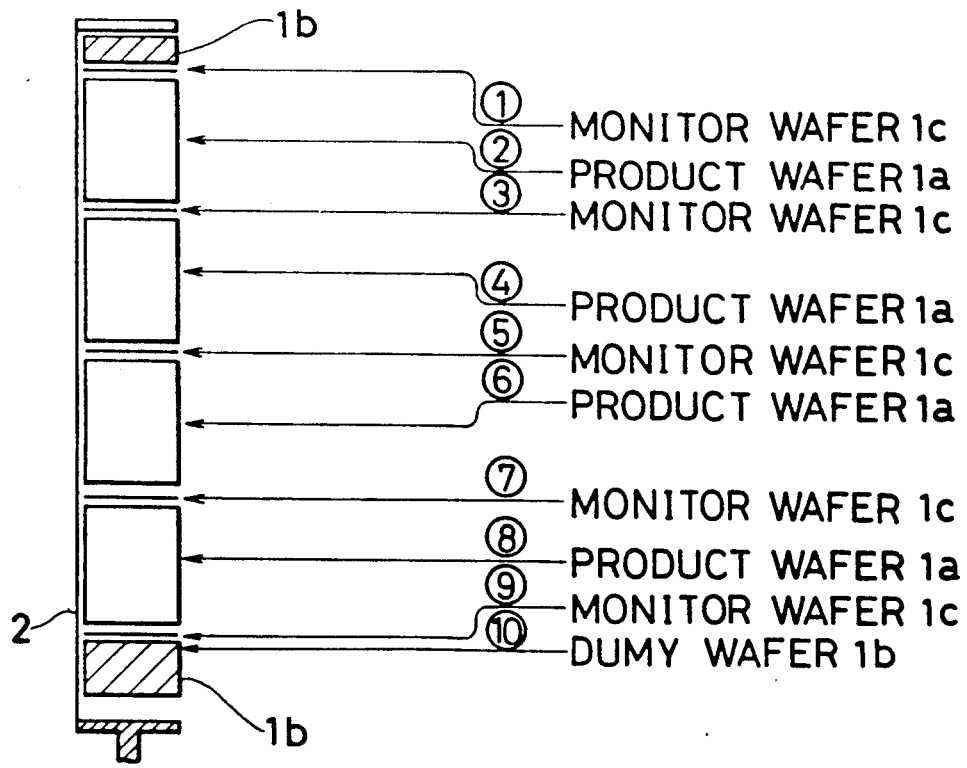

Remaining wafers of any type are sequentially transferred as shown in FIG. 6 by the sequence of movement line ①-⑩ from the upper position of the boat 2 and to the lower position downwardly.

Figure 7:
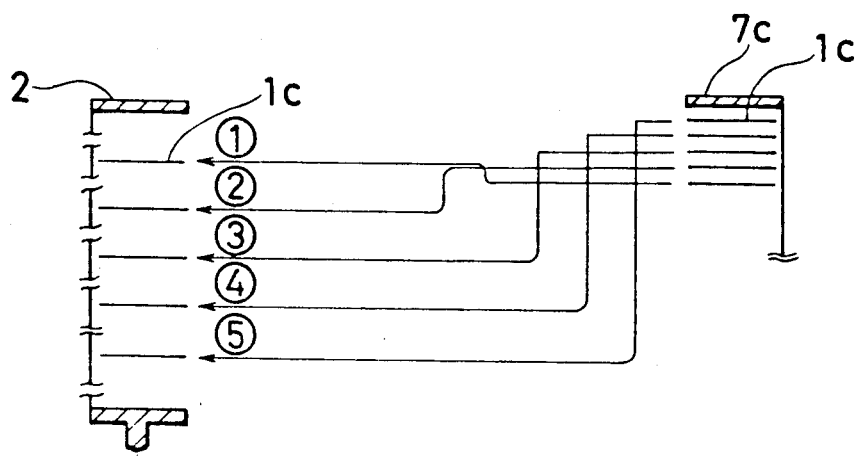
Figure 8:
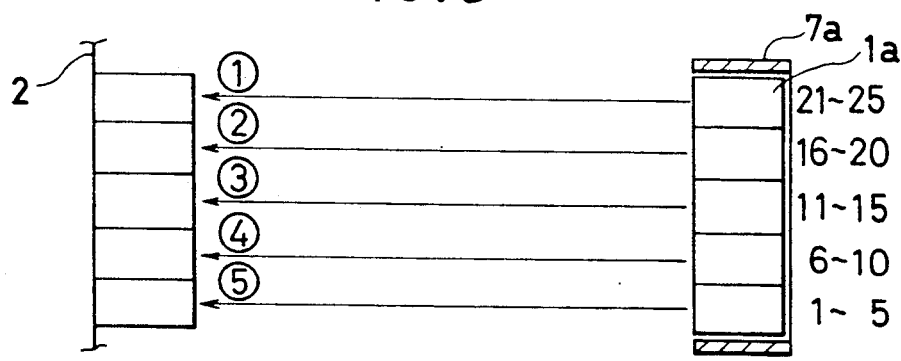

Concerning the transfer of the monitor wafers 1c, the lowest monitor wafer 1c stocked in the monitor wafer cassette 7c is repetitiously sucked and chucked by the top chuck plate 53 of the wafer chuck 29 and inserted successively into the boat 2 from its top position as shown by the movement lines or traces ①-⑤ in FIG. 7. As to the transfer of the product wafers 1a, five wafers 1a are chucked at a time from the top of the product wafers 1a and placed in the boat 2 from the upper position to the bottom (see these traces ①-⑤ of FIG. 8). It is noted that the number of wafers 1a charged to the cassette 7a is twenty five (25), so that five transfer procedures are sufficient to transfer all wafers in the cassette and it is not necessary to transfer wafers less than five.

Figure 9:
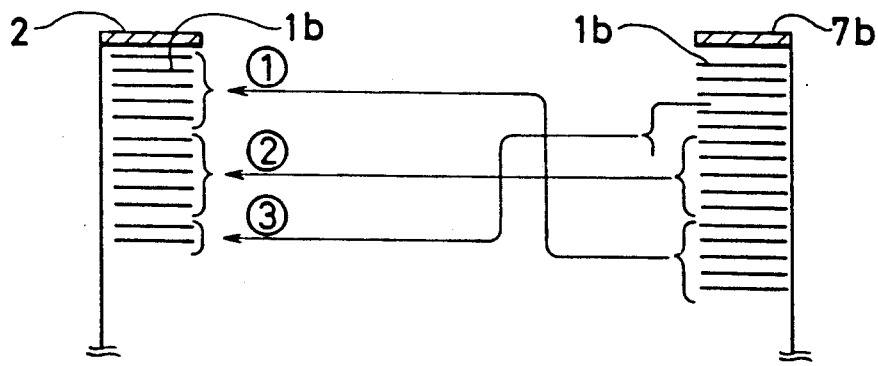

Next, the case in which the number of the upper dummy wafers 1b is twelve (12) and that of the lower dummy wafers 1b is three (3) totaling fifteen (15) in which case the number of the lower dummy wafers is less than five (5) will be described with reference to FIG. 9.

Concerning the transfer procedure of the upper dummy wafers, the transfer of five wafers is done twice and another transfer of only two wafers is carried out (see the traces ①-③). It is noted that the three lower dummy wafers are transferred at a time after the transferences of the product wafers and the monitor wafers. In this case, because a sufficiently large space is provided under the wafer arrangement in the boat 2, it is apparent that no interference occurs between the wafer chuck 29 and the boat 2 during a transfer procedure of the lower dummy wafers.

When the number of the upper dummy wafers to be transferred is smaller than five (5), the transfer procedures shown by the traces ②, ③, ④ in FIG. 5 are employed. The transfer or movement of wafers shown by the trace ⑤ in FIG. 5 can be done after the transfers of the product wafers and the dummy wafers.

It is understood that the transfer of the wafer from the boat 2 to each cassette 7a, 7b, 7c will be done by reversing the transfer procedures above.

As mentioned above, considering that the number of all the wafers to be charged to the cassettes is twenty five (25), it is preferable to use a system for chucking and transferring five wafers at a time. The number of the dummy wafers placed at the top and the bottom of the boat 2 is 5×n, so that the transfer of the dummy wafers of less than five (a fraction handling) is in principle completed in a single time with a good productivity. The monitor wafers are handled by a principle of one-by-one and it is possible to arrange the wafers of these kinds in a various manner of arrangement. Because the product wafers are transferred five by five, it is not necessary to do a fraction handling of the wafers of less than five resulting in a speedy operation of the wafer transfer mechanism according to &he present invention.

Figure 10:
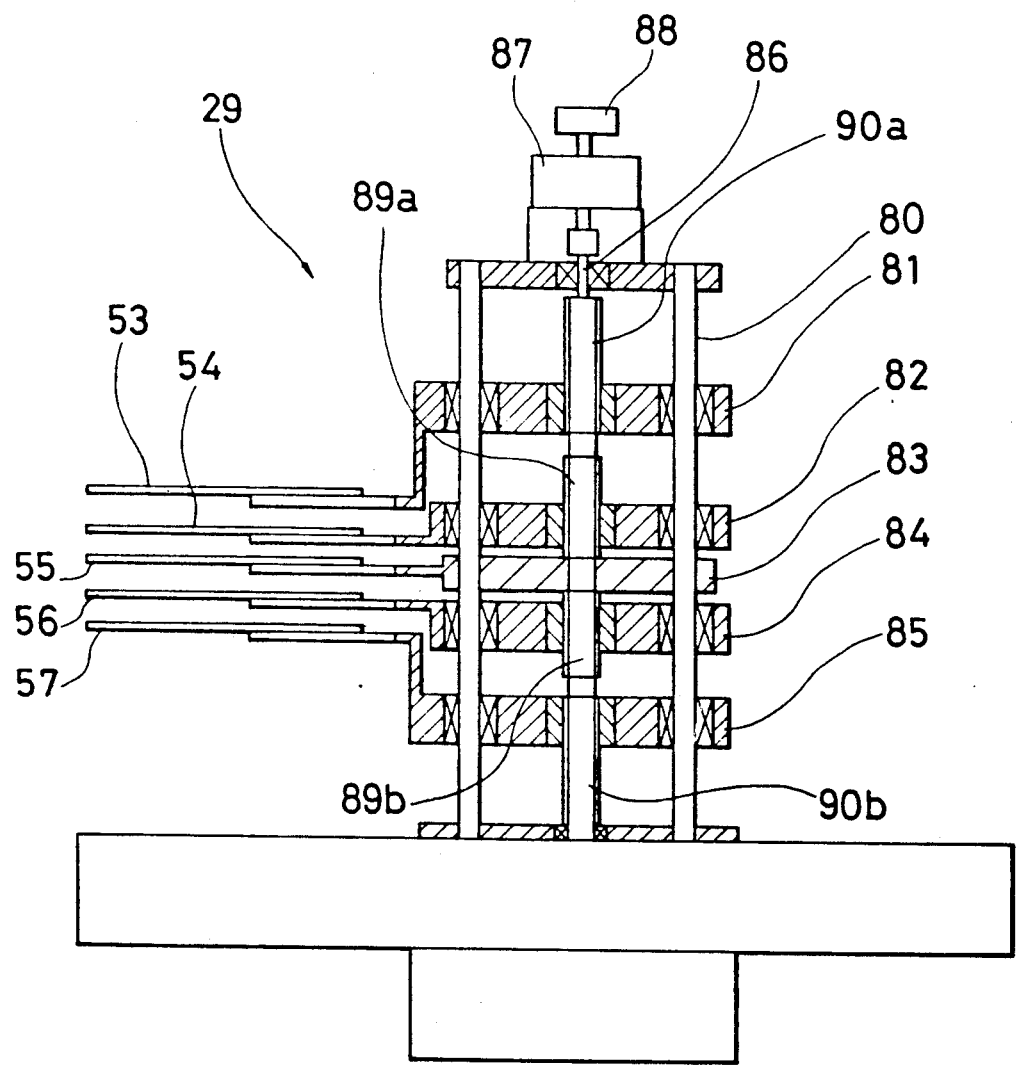
FIG. 10 is an explanation view of another embodiment of the wafer chuck.
Figure 11:
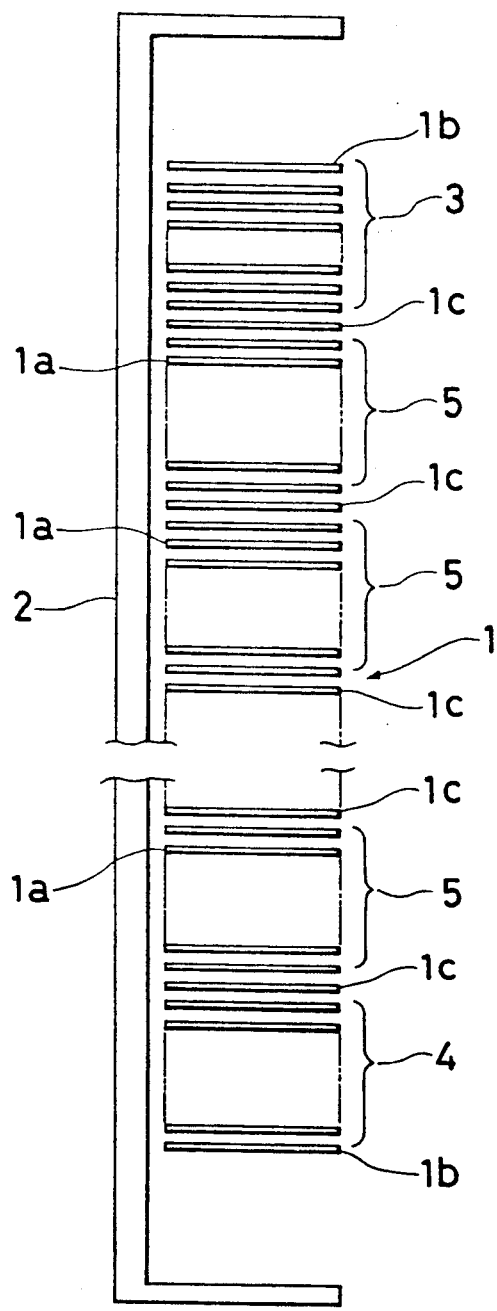
FIG. 11 shows an example of the wafer arrangement held in a boat.

The pitch or gap of the openings of the cassettes is 3/16 inch for 6" wafers and ¼ inch for 8" wafers. Consequently, it is necessary to install some device for changing the pitch. The pitch changing mechanism is as shown in FIG. 10.

A set of slide base plates 81, 82, 84, 85 are slidably fitted on the guide shaft 80. The chuck plates 53, 54, 55, 56, 57 are attached to the slide base plates 81 and 82, the supporting base plate 83, and slide base plates 84 and 85.

The screw shaft 86 extends through the slide base plates 81, 82, 84, 85 and rotates by means of a pitch control motor 87. The rotation volume of the control motor 87 is detected by the encoder 88.

The screw shaft 86 is rotatably fitted to the support base plate 83. The slide base plate 82 is engaged with the screw shaft 86 through the first engagement portion 89a, and the slide base plate 81 is engaged with the screw shaft 86 through the second engagement portion 90a. The screw shaft 86 is engaged with the slide base plate 84 through the third engagement portion 89a and the screw shaft 86 is engaged with the slide base plate 85 through the fourth engagement portion 90b. The first engagement portion 89a has the same pitch as, and the reverse rotation thread to, the third engagement portion 89b and the second engagement portion 90a has the same pitch as and the reverse rotation thread to the fourth engagement portion 90b. The pitch of the second and the fourth engagement portions 90a and 90b is twice that of the first and the third engagement portions 89a and 89b. In consequence, the rotation of the pitch adjusting motor 87 moves vertically respective chuck plates 53, 54, 55, 56, 57 so as to separate from and approach to each other with the same relation or ratio between respective chuck plates being kept.

It is possible to operate a controller (not shown) for adjusting the pitch control motor 87 with the operative command from the main control apparatus 71 and add a pitch controlling procedure to the operative condition to be set and inputted to the input board 70, enabling the wafer transfer method and mechanism therefor to be made adaptable even though there is a difference between the wafer stocking pitches of the cassette and the boat.

Figure 12:
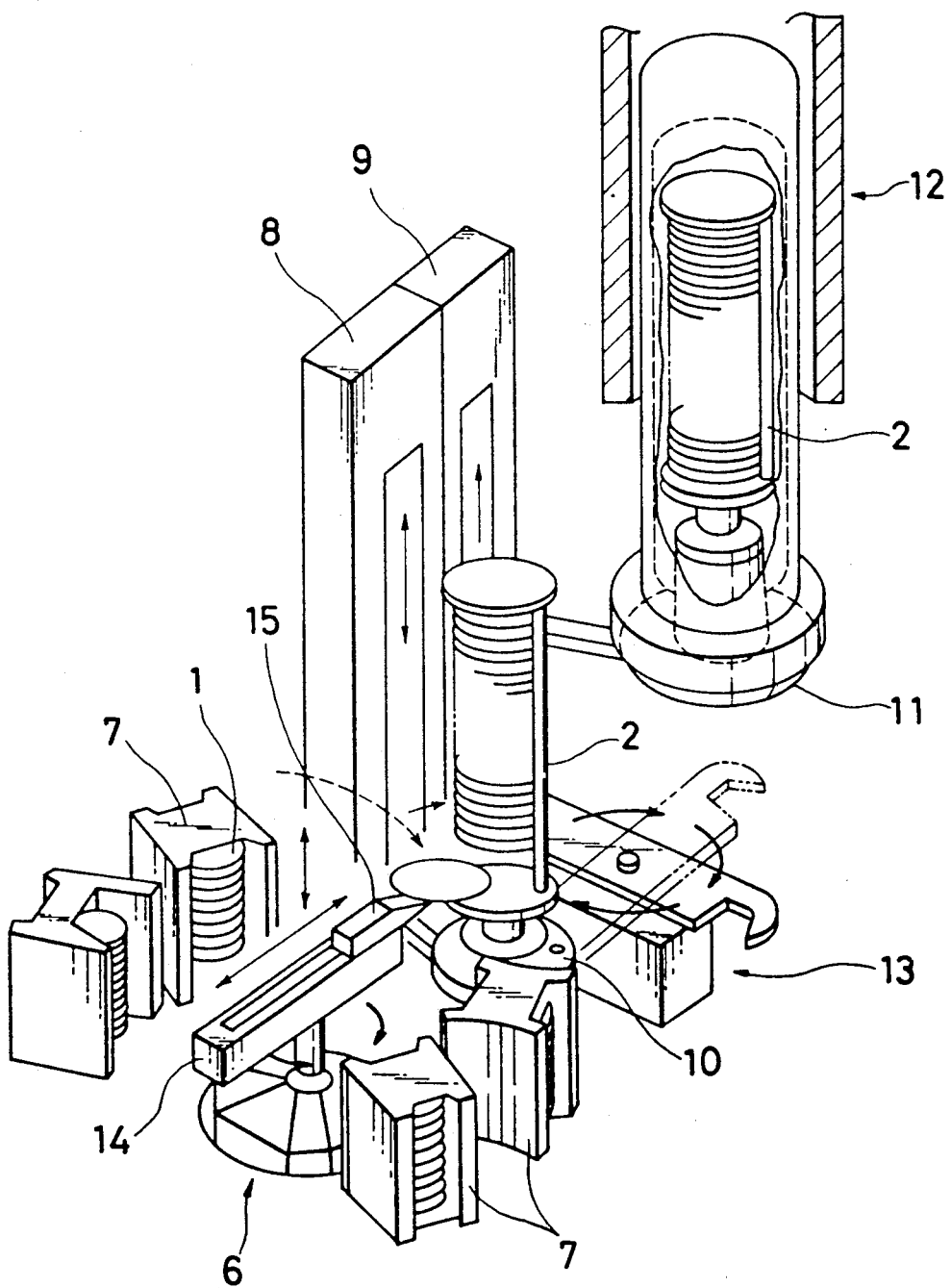
FIG. 12 is an explanation of the conventional wafer transfer mechanism.
Figure 13:
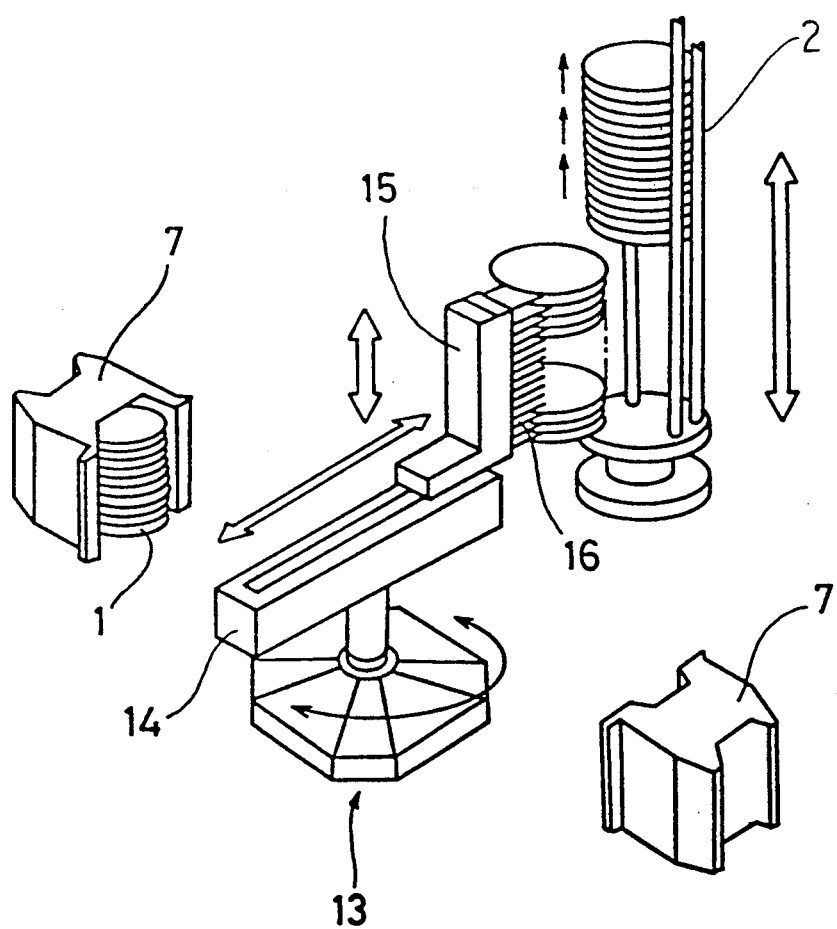
FIG. 13 is an explanation view of another conventional wafer transfer mechanism.

It is apparent that the wafer transfer system and the control apparatus for the system of the present invention is applied to the conventional diffusion apparatus provided with wafer cassettes which are arranged horizontally as shown in FIG. 12.

According to the characteristics of the wafer transfer system and the control apparatus for the system, various wafers are transferred five by five efficiently when the wafer stocking number in the cassette is twenty five (25), without any fraction handling of the product wafers and the dummy wafers are transferred with the smallest motion of the mechanism.

Because the transfer functions are carried out with motions of the smallest number as mentioned above, a simple sequence program can be used in the control apparatus for the wafer transfer mechanism.

Because the wafers less than five or a fraction handling of wafers can be done, it is not necessary to previously form the predetermined wafer arrangement and charge wholly the wafer arrangement to the particular cassette. According to the present invention, changing the operative condition to be inputted through the input board enables the wafers to be easily arranged in the desired wafer arrangement.

We claim:

1. A wafer transfer method for use in a vertical CVD diffusion apparatus provided with a boat having plural spaces arranged in multiple steps, to which spaces wafers are stocked in a horizontal orientation, comprising the steps of;

transferring product wafers in groups of five;
transferring dummy wafers in groups of five or less than five wafers; and
transferring one or more monitor wafers and inserting said monitor wafers between said product wafers one by one.

2. The wafer transfer method in the vertical CVD diffusion apparatus according to claim 1, wherein the dummy wafers are transferred to spaces at the top and bottom of the boat and wherein the total number of the dummy wafers transferred to the top and the bottom spaces in the boat is a multiple of five (5).

3. The wafer transfer method in the vertical CVD diffusion apparatus according to claim 2, wherein when the number of the dummy wafers to be transferred to the bottom spaces of the boat is more than five (5), the step of transferring dummy wafers further comprises shifting a fraction of the dummy wafers less than five to the lowest space of the wafer spaces in the boat.

4. The wafer transfer method in the vertical CVD diffusion apparatus according to claim 2, wherein when the number of the dummy wafers to be transferred to the bottom of the boat is less than five (5), wafers of a number which is not a multiple of five (5), are directly transferred to the upper spaces of the boat, and said number of dummy wafers to be transferred to the bottom of the boat are transferred after the completion of the transfer of the product wafers and the monitor wafers.

* * * * *